(12) United States Patent
Paul et al.

(10) Patent No.: US 8,975,142 B2
(45) Date of Patent: Mar. 10, 2015

(54) FINFET CHANNEL STRESS USING TUNGSTEN CONTACTS IN RAISED EPITAXIAL SOURCE AND DRAIN

(71) Applicant: GLOBALFOUNDRIES, Inc., Grand Cayman (KY)

(72) Inventors: Abhijeet Paul, Albany, NY (US); Abner Bello, Clifton Park, NY (US); Vimal K. Kamineni, Albany, NY (US); Derya Deniz, Troy, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 93 days.

(21) Appl. No.: 13/870,854

(22) Filed: Apr. 25, 2013

(65) Prior Publication Data

US 2014/0319614 A1    Oct. 30, 2014

(51) Int. Cl.
*H01L 29/786* (2006.01)
*H01L 29/78* (2006.01)
*H01L 21/336* (2006.01)
*H01L 29/66* (2006.01)
*H01L 21/8234* (2006.01)
*H01L 21/8238* (2006.01)

(52) U.S. Cl.
CPC ........ *H01L 29/66795* (2013.01); *H01L 29/785* (2013.01); *H01L 21/823431* (2013.01); *H01L 21/823821* (2013.01); *H01L 29/66636* (2013.01)

USPC ........... 438/283; 438/300; 438/595; 438/685; 257/288; 257/347; 257/365; 257/368; 257/774; 257/E29.12; 257/E29.116; 257/E29.151; 257/E21.633; 257/E21.634

(58) Field of Classification Search
CPC .............. H01L 29/785; H01L 29/7858; H01L 29/66795; H01L 29/66636; H01L 21/823431; H01L 21/823421
USPC .......... 438/283, 300, 595, 685; 257/288, 347, 257/365, 368, 774, E29.12, E29.116, 257/E29.151, E21.633, E21.634
See application file for complete search history.

(56) References Cited

U.S. PATENT DOCUMENTS

| | | | |
|---|---|---|---|
| 8,358,012 B2 * | 1/2013 | Haran et al. ................... | 257/774 |
| 8,502,319 B2 * | 8/2013 | Takeda .......................... | 257/368 |
| 2007/0066060 A1 * | 3/2007 | Wang ............................. | 438/685 |
| 2008/0054326 A1 * | 3/2008 | Wong et al. ................... | 257/300 |
| 2012/0199887 A1 | 8/2012 | Chan et al. | |

* cited by examiner

*Primary Examiner* — Dao H Nguyen
(74) *Attorney, Agent, or Firm* — Wayne F. Reinke, Esq.; Heslin Rothenberg Farley & Mesiti P.C.

(57) ABSTRACT

Performance of a FinFET is enhanced through a structure that exerts physical stress on the channel. The stress is achieved by a combination of tungsten contacts for the source and drain, epitaxially grown raised source and raised drain, and manipulation of aspects of the tungsten contact deposition resulting in enhancement of the inherent stress of tungsten. The stress can further be enhanced by epitaxially re-growing the portion of the raised source and drain removed by etching trenches for the contacts and/or etching deeper trenches (and corresponding longer contacts) below a surface of the fin.

16 Claims, 4 Drawing Sheets

FINFET CHANNEL STRESS USING TUNGSTEN CONTACTS IN RAISED EPITAXIAL SOURCE AND DRAIN

BACKGROUND OF THE INVENTION

1. Technical Field

The present invention generally relates to semiconductor devices and methods of fabricating semiconductor devices. More particularly, the invention relates to inducing physical stress on a channel region of a FinFET device.

2. Background Information

The overall performance of integrated circuits (ICs) and semiconductor devices relies on the performance of transistors, such as FinFETs. An increase of current flow through a channel region situated under a gate dielectric and between the source and drain region, leads to an increase in the charge carrier mobility in the channel region. An increase in the charge carrier mobility in a transistor channel leads to a enhanced channel conductivity during operation and correspondingly faster device operation. One way to influence charge carrier mobility in a channel is to create tensile or compressive stress in the channel region to produce a corresponding strain in the channel region which, in turn, results in a modified mobility for electrons and holes respectively. For example, creating tensile strain in the channel region of a silicon layer having a standard crystallographic configuration may increase the mobility of electrons, thereby enhancing the performance of N-type transistors. On the other hand, creating compressive strain in the channel region may increase the mobility of holes, thereby enhancing the performance of P-type transistors.

Current techniques involve creating tensile or compressive stress that may result in corresponding strain, in or below the channel region by introducing stress-inducing materials such as silicon/germanium layer or silicon/carbon layer or tungsten layer. Although the transistor performance may be considerably enhanced by the introduction of stress-inducing materials, continued significant efforts have to be made in increasing the stress in the channel region.

Hence, there continues to be a need to fabricate semiconductor devices with increased charge carrier mobility.

SUMMARY OF THE INVENTION

The shortcomings of the prior art are overcome and additional advantages are provided through the provision, in one aspect, of a method of inducing physical stress on a channel region of a FinFET. The method includes providing an intermediate semiconductor structure of a FinFET, the structure including a semiconductor substrate and at least one fin coupled to the substrate. The fin includes a source region, a drain region and a channel between the source region and the drain region. The method further includes epitaxially growing a semiconductor material on the source region, and the drain region, removing the epitaxially grown semiconductor material, and epitaxially re-growing the semiconductor material on the source region and the drain region, such that a raised source and a raised drained are created. The method further includes etching a trench in the raised source and the raised drain and creating tungsten contacts in the raised source trench and raised drain trench, wherein tungsten contacts have a stress different from an inherent stress of tungsten.

The present invention provides, in a second aspect, a FinFET, including a semiconductor substrate, and at least one semiconductor fin coupled to the substrate. The at least one fin includes a source, a drain and a channel between the source and the drain, the channel being situated under a gate. The source and drain are raised, and include a regrown epitaxial semiconductor material. The device further includes a source contact situated in a lined trench in the source and a drain contact situated in a lined trench in the drain. The contacts include tungsten having a stress different from an inherent stress of tungsten, the raised source and drain together with the tungsten contacts exerting a desired stress on the channel.

These, and other objects, features and advantages of this invention will become apparent from the following detailed description of the various aspects of the invention taken in conjunction with the accompanying drawings.

DETAILED DESCRIPTION OF THE INVENTION

Figure 1:
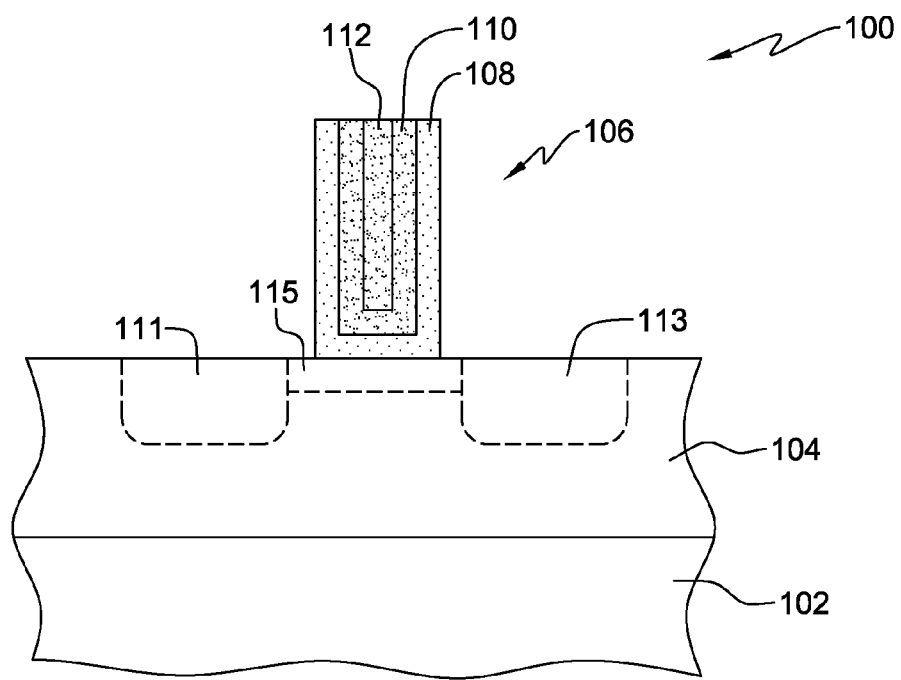
FIG. 1 is a cross-sectional view of one example of an intermediate structure of a FinFET device in fabrication, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified.

In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Reference is made below to the drawings, which are not drawn to scale for ease of understanding, wherein the same reference numbers are used throughout different figures to designate the same or similar components.

FIG. 1 is a simplified cross-sectional view of a portion of a FinFET device having an intermediate semiconductor structure 100, at an intermediate stage of manufacturing. At the point of fabrication depicted in FIG. 1, the intermediate semiconductor structure 100 includes a semiconductor substrate 102 and at least one fin 104 coupled to the substrate 102. As one skilled in the art will know, a FinFET is a Field Effect Transistor having the source/drain/channel region situated above the substrate in one or more raised structures roughly resembling fins in some designs. A FinFET is typically on the order of tens of nanometers in width. Advantageously, the fin structure helps to control current leakage through the transistor in the off stage, and a double gate or tri-gate structure may be employed to control short channel effects. The present invention may include either an n-type FinFET or a p-type FinFET or a combination thereof.

Returning to FIG. 1, the semiconductor substrate 102 may include, in one example, any silicon-containing substrate including, but not limited to, silicon (Si), single crystal silicon, polycrystalline Si, amorphous Si, silicon-on-insulator substrates, silicon-on-nothing and the like. The semiconductor substrate 102 may include other suitable elementary semiconductors, such as germanium in crystal; a compound semiconductor such as silicon carbide (SiC), gallium arsenide (GaAs), gallium phosphide (GaP), indium phosphide (InP), indium arsenide (InAs), and/or indium antimonide (InSb) or combinations thereof; an alloy semiconductor including GaAsP, AlInAs, AlGaAs, GaInAs, GaInP, or GaInAsp or combinations thereof. The semiconductor substrate 102 may also include isolation regions, various doped regions, other suitable features, and/or combinations thereof.

Continuing with FIG. 1, the fin structure 104 may include one or more fins, made of any suitable material. In the present example, the fin 104 may include silicon fins with regions designated for a source 111, drain 113 and channel 115 between the source and drain. Although not critical to the invention, a gate stack 106 is disposed perpendicular to the fin structure 104, each gate stack including one or more conformally deposited layers such as a gate dielectric layer 108, a work function layer 110 disposed over the gate dielectric layer 108 and a gate material 112 disposed over the work function layer 110. The various layers depicted in the figures may be formed from a variety of different materials using a variety of techniques, such as, for example, atomic layer deposition (ALD) and chemical vapor deposition (CVD). The thickness of the gate layers may also vary, depending upon the particular application.

In one example, the gate dielectric layer 108 may be formed of a material such as silicon dioxide or a high-k dielectric material with a dielectric constant k greater than about 3.9 (e.g., k=3.9 for $SiO_2$) and may be deposited by performing a suitable deposition process, such as atomic layer deposition (ALD), chemical vapor deposition (CVD), physical vapor deposition (PVD), or the like. Examples of high-k dielectric materials that may be used in the gate dielectric layer 108 include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide and lead zinc niobate. One or more work-function layers 110 may be conformally deposited over the gate dielectric layer 108, for example, via a deposition process such as ALD, CVD or PVD. The work-function layer(s) 110 may include, for instance, one or more P-type metals or one or more N-type metals, depending on whether the gate structure is to include, for instance, a PFET or an NFET. The work-function layer(s) 110 may include an appropriate refractory metal nitride, for example, those from Groups IVa-VIa in the Periodic Table, including, for example, titanium nitride (TiN), tantalum nitride (TaN), titanium aluminum nitride (TiAlN), tantalum aluminum nitride (TaAlN), niobium nitride (NbN), vanadium nitride (VN), tungsten nitride (WN), and the like. The gate material 112, in one example, may include polysilicon or polycrystalline silicon. In another example, the gate material 112 may include a metal, such as, for example, tungsten (W), aluminum (Al), nickel (Ni), cobalt (Co), and titanium (Ti) and may be conformally deposited over the work function layer(s) 110 using processes, such as for instance, atomic layer deposition (ALD) or chemical vapor deposition (CVD).

Figure 2:
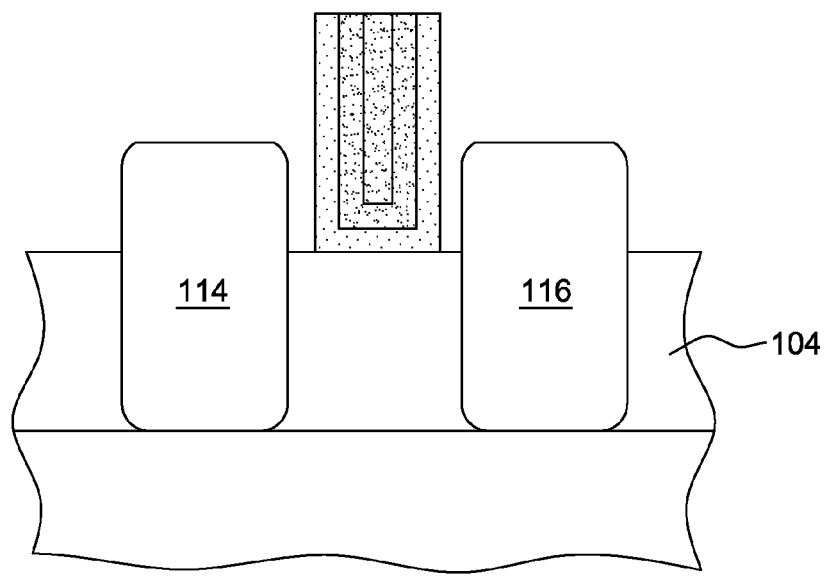
FIG. 2 depicts one example of the intermediate structure of FIG. 1, after epitaxially growing a raised source and a raised drain in the fin structure, in accordance with one or more aspects of the present invention.

Referring to FIG. 2, a selective epitaxial growth process may be performed in the source region and the drain region of the fin structure 104 to form raised source 114 and a raised drain 116 in the designated regions of FIG. 1. It may be noted that the raised source 114 and the raised drain 116 preferably extend above the surface of the fin structure 104 such as to increase a stress on the channel and facilitate the deposition of tungsten contacts in subsequent fabrication steps. As explained further below, tungsten has an inherent tensile stress that can be altered, based on deposition conditions. Although not critical to the present invention, the resultant height of each of the raised source 114 and the raised drain 116, above the fin structure 104 may be about 20 nanometers to about 40 nanometers and the total resultant height of each of the raised source 114 and the raised drain 116, may be about 60 nm to about 80 nm. The raised source 114 and the raised drain 116 may include stress-inducing materials such as one or more tensile stress inducing materials to improve the tensile stress of an n-type FinFET transistor, or one or more compressive stress inducing materials to improve the compressive stress of a p-type FinFET transistor. It may also be understood, in another example, that the source region and the drain region may be etched (i.e., etching of the fin itself) to create a source trench and a drain trench before the expitaxial growth of the stress inducing materials. Subsequently, the stress inducing materials may be epitaxially grown as the raised source in the source trench and the raised drain in the drain trench.

Continuing further with FIG. 2, in one example, the tensile stress of an n-type FinFET may be improved using tensile stress inducing materials for the raised source and drain, such as, for example, silicon doped with phosphorus (SiP) where the atomic percentage of phosphorus may be greater than zero and up to about 3 percent or silicon doped with carbon (SiC), where the atomic percentage of carbon may be about 1 percent to about 3 percent. The term "tensile stress inducing material" denotes a material in which the intrinsic stress produces a tensile stress in one or more adjacent materials. The tensile stress inducing materials are epitaxially grown over the silicon (Si) fins in the source and the drain region and may be realized using selective epitaxial growth via various methods, such as, for example, chemical vapor deposition (CVD), reduced pressure CVD (RPCVD), low pressure CVD (LPCVD) or other applicable methods. The selective epitaxial growth starts when at least one semiconductor source gas is injected into the reaction chamber. In one example, silicon doped with phosphorus may be formed using gases such as, for example, dichlorosilane ($SiH_2Cl_2$) gas or silane ($SiH_4$) with phosphine ($PH_3$). In another example, the semiconductor source gas may be a silicon source gas, such as, for example, silane ($SiH_4$) gas, a disilane ($Si_2H_6$) gas, a dichlorosilane ($SiH_2Cl_2$) gas, a $SiHCl_3$ gas and a $SiCl_4$ gas or may include a carbon source gas for the growth of SiC and SiGeC.

In another example, the compressive stress of a p-type FinFET may be improved using compressive stress inducing materials for the raised source and drain, such as, for example, silicon germanium (SiGe) where the atomic percentage of germanium may be about 20 percent to about 80 percent, and may be epitaxially grown above the silicon (Si) fins 104 to form the raised epi-layer 114. The term "compressive stress inducing material" denotes a material in which the intrinsic stress produces compressive stress in one or more adjacent materials. The epitaxial growth may be realized using selective epitaxial growth via various methods, such as, for example, chemical vapor deposition (CVD), reduced pressure CVD (RPCVD) or other applicable methods and may be initiated using a silicon germanium source gas, which may include a stoichiometric ratio of silicon source gas and the germanium source gas. The semiconductor source gas may instead be, for example, one of the more advanced gases from the family of germyl-silanes, such as $H_3GeSiH_3$, $(H_3Ge)_2SiH_2$, $(H_3Ge)_3SiH$, or $(H_3Ge)_4Si$.

As one skilled in the art will understand, the epitaxial growth in the raised source and the raised drain region may induce a substantial amount of stress in the channel region of the fin structure. However, a portion of the epitaxial growth is etched to create a source trench in the source region and a drain trench in the drain region, in order to fabricate tungsten contacts, and the etching of the source trench and the drain trench may result in a substantial loss of the stress that would otherwise be induced. As will be discussed subsequently in greater detail, the present invention seeks to leverage the inherent stress present in the tungsten contacts to substitute for the substantial amount of stress lost during the etching of the epitaxial growth. The invention further proceeds to enhance the stress in the contacts by controlling the tungsten deposition conditions such as pressure and temperature to create tungsten having a stress different from the inherent stress of tungsten and exert a desired stress on the channel region.

Figure 3:
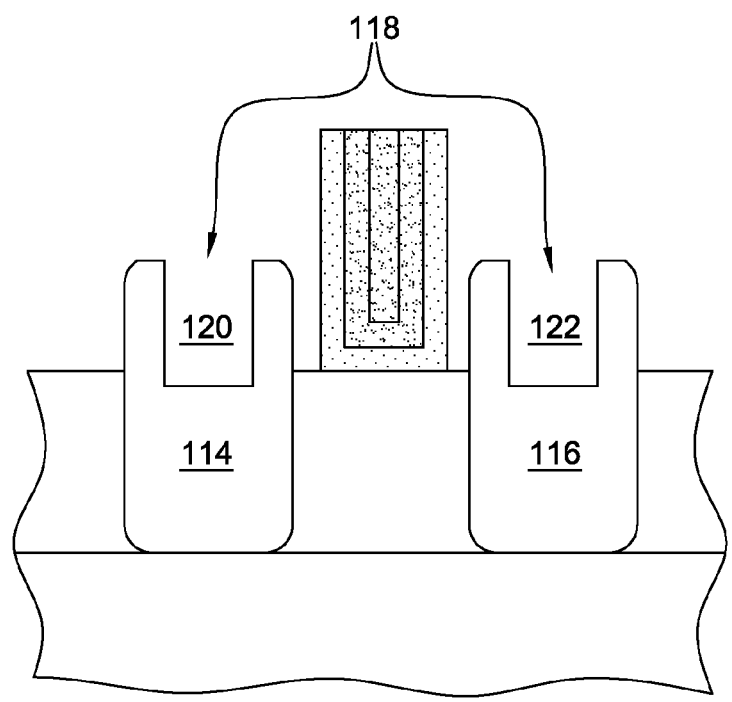
FIG. 3 depicts one example of the intermediate structure of FIG. 2, after etching a trench in the raised source and the raised drain, in accordance with one or more aspects of the present invention.

Accordingly, as shown in FIG. 3, the raised source 114 in the source region and the raised drain 116 in the drain region may be etched to form trenches 118, e.g., source trench 120 and drain trench 122 by etching at least a portion of the raised source 114 and the raised drain 116, so as to facilitate subsequent tungsten contact fabrication. The portion of the raised source 114 and the raised drain 116 may be etched by performing an etching process such as, for example, an anisotropic or isotropic etching process, although an anisotropic etching process, for example, reactive ion etching, may be preferred. In one example, the depth of trenches 118, e.g., source trench 120 and drain trench 122 may be about 10 nm to about 40 nm.

Figure 4:
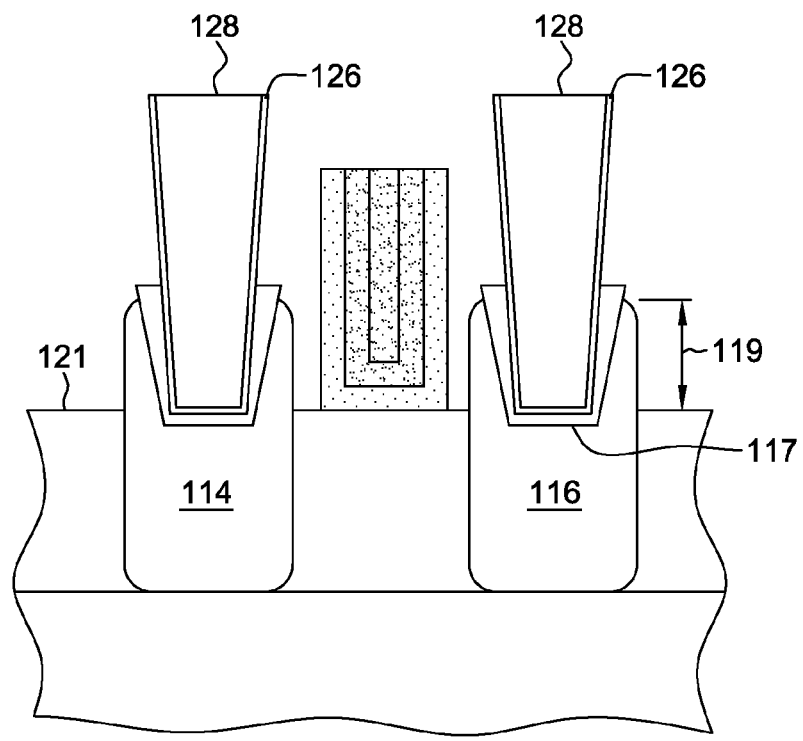
FIG. 4 depicts one example of the intermediate structure of FIG. 3, after creating tungsten contacts in the raised source trench and the raised drain trench, in accordance with one or more aspects of the present invention.

Referring to FIG. 4 and as is known in the art that tungsten has poor adhesion to the underlying layers, the trenches 118, e.g., source trench 120 and the drain trench 122 of FIG. 3, may typically be lined with a contact liner including a barrier/adhesive layer 126. Although not shown for clarity of the invention, one skilled in the art will know that silicide and a gettering layer protecting the silicide are also typically present. The gettering layer ensures that oxygen, formed due to exposure of underlying silicide to ambient conditions, remaining after various post pre-clean conditions (e.g., argon (Ar) sputter, SiCoNi dry etch conditions), is gettered of the underlying silicide layer on the raised source 114 and the raised drain 116 and also to decrease contact resistance.

Continuing further with FIG. 4, a barrier/adhesive layer 126 may be deposited over the gettering layer 124, to protect the adhesive layer from eroding on exposure to harsher chemistries typically employed to accomplish subsequent tungsten metallization as well as preventing oxidation on exposure to air. The barrier layer 126 may be deposited by using conventional deposition processes, such as, for example, physical vapor deposition (PVD), chemical vapor deposition (CVD), pulsed CVD, plasma-enhanced CVD (PECVD), metal organic chemical vapor deposition (MOCVD), atomic layer deposition (ALD), plasma-enhanced ALD (PEALD) or sputtering methods. The thickness of the barrier layer 126 may be about 2 nanometers to about 3 nanometers. It may be noted that the materials used to form the barrier layer may influence the stress of the subsequently deposited tungsten contacts. In one example, the barrier layer 126 may include titanium-based materials (e.g., TiN, TiC, TiCN, TiSiN) or tantalum-based materials (e.g., TaN, TaC, TaCN, TaSiN) to create tensile stress in the contacts formed above the raised source 114 and the raised drain 116 region, where as fluorine-free tungsten-based materials (e.g., WN, WC, WCN, WSiN) may create a compressive stress in the contacts. It may be noted that the use of a fluorine free tungsten-based nucleation layer may eliminate the need for additional adhesive layers such as, for example, titanium-based materials (e.g., TiN), as fluorine free tungsten-based nucleation layers are known in the art to be good barrier/adhesive layers as well. In a specific example, titanium nitride (TiN) may be formed using a titanium precursor, such as, for example, tetrakis (dimethylamino)titanium (TDMAT) or titanium tetrachloride (TiCl4) and a reagent plasma, such as, for example, nitrogen plasma during a plasma-enhanced ALD (PE-ALD) process.

Further, continuing with FIG. 4, in one example, a tungsten nucleation layer (not shown) may be deposited over the barrier layer 126 to facilitate the subsequent formation of the bulk tungsten material, using conventional deposition processes such as chemical vapor deposition (CVD), atomic layer deposition (ALD) and pulsed nucleation layer deposition (PNL) deposition processes. The thickness of the nucleation layer may be about 2 nm to about 3 nm and may be deposited by performing alternating pulsing sequences of boron-containing reducing agent and tungsten-containing precursor in presence of a reducing agent. The boron-containing reducing agents included, but are not limited to borane ($BH_3$), diborane ($B_2H_6$), triborane, boron halides such as, for example, boron trifluoride ($BF_3$), boron trichloride ($BCl_3$) and the like. The tungsten-containing precursors may include tungsten-containing gases such as, for example, $WF_6$, $WCl_6$ and $W(CO)_6$ and the like, while the reducing agents may include hydrogen gas ($H_2$), silane ($SiH_4$), disilane ($Si_2H_6$), hydrazine ($N_2H_4$) and germane ($GeH_4$). The bulk material of tungsten 128 having a stress different from the inherent stress of tungsten (about 1 GPa to about 2 GPa), may be deposited over the nucleation layer via a two step chemical vapor deposition process.

One example of the bulk deposition process involves a chemical vapor deposition (CVD) reaction of tungsten-containing precursor, such as tungsten hexafluoride (WF6), and reducing gases, such as hydrogen ($H_2$) to produce tungsten and a by-product, such as for example, hydrogen hexafluoride (HF) at temperature of about 250° C. to about 400° C. The tungsten formed, during the deposition process, may result in a bulk tungsten material having a tensile stress. It may be noted that by controlling the deposition processes of bulk tungsten and by controlling deposition conditions such as, for example, temperature and pressure, the inherent stress of tungsten may be converted from tensile stress to a higher tensile stress, or may be converted to a desired compressive stress by using various nucleation/adhesive layers such as, for example tungsten-based nucleation layers (e.g., WN, WC, WCN, WSiN). In one example, the height of the tungsten contacts deposited in the source and the drain trenches may be about 70 nm to about 120 nm.

Additionally or alternatively, the present invention seeks to transfer the enhanced stress generated in the tungsten contacts, to the channel region situated under the gate by modulating the depth of the source trench and the drain trench. In one example, the source trench and the drain trench may be etched to a depth approximately parallel with a top surface of the fin. In another example, the source trench and the drain trench may be etched substantially below a top surface of the fin structure and positioning the tungsten contacts substantially close to the channel region. Further in another alternative or additional example, the enhanced stress generated in the tungsten contacts may be transferred to the channel region of the fin structure by etching the raised source and the raised drain to create a source trench and a drain trench and epitaxially re-growing the semiconductor material on the raised source and the raised drain region. Alternatively, the enhanced stress generated in the tungsten contacts may be transferred to the channel region of the fin structure by partially etching the raised source and the raised drain to create a partial source trench and a partial drain trench and epitaxially re-growing the semiconductor material on the raised source and the raised drain regions. The invention further seeks to transfer the enhanced stress from the tungsten contacts to the channel region by etching the raised source and the drain region to create a source trench and a drain trench and epitaxially re-growing the semiconductor material on the raised source and the raised drain region and simultaneously etching epitaxially re-grown raised source and drain trenches substantially deep below a top surface of the fin structure.

Accordingly, the enhanced stress generated in the tungsten contacts 128 during the deposition step discussed with respect to FIG. 4, may be transferred to the channel region 115, by modulating the depth of the trenches etched (see FIG. 3), prior to the deposition process. As discussed above, the raised source and the raised drain are etched to create a source trench 114 and a drain trench 116. It may be noted that the source trench 114 and the drain trench 116 may be etched to a depth 119 approximately coinciding with a bottom surface 117 of the gate and a top surface 121 of the fin structure 104. As was discussed with FIG. 3, the portion of the raised source 114 and the raised drain 116 may be etched by performing an etching process such as, for example, an anisotropic or isotropic etching process, although an anisotropic etching process, for example, reactive ion etching may be preferred.

Figure 5:
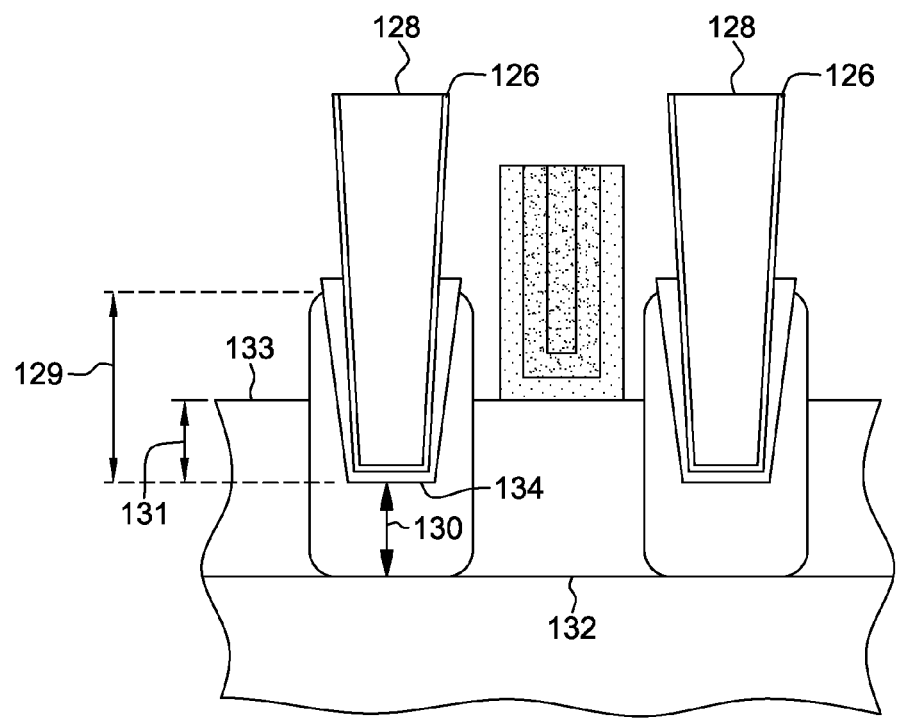
FIG. 5 depicts one example of the intermediate structure of FIG. 3, after etching a trench in the raised source and the raised drain to a depth below a top surface of the fin, in accordance with one or more aspects of the present invention.

The enhanced stress generated in the tungsten contacts 128 and transferred to the channel region, may be further enhanced by etching the raised source 114 and the raised drain 116 to a depth 129 substantially below the top surface 133 of the fin structure 104, as depicted in FIG. 5. Although shown with the contacts therein, it will be understood that the trenches in the source and drain are made prior to contact deposition. In one example, the distance 131 of the trench etched below the surface of the fin may be about 10 nm to about 20 nm. It may be noted that the etched trench in the raised source and drain resides over a substantial amount of the fin structure so as to prevent current crowding. Preferably, a distance 130 between a bottom of the trenches 134 and a bottom 132 of the fin is no more than about 10 nm.

As discussed above and shown in FIG. 6, the raised source 114 and the raised drain 116 may be etched using any of the conventional etching processes to create a source trench and a drain trench. In another aspect, the removed portions of the source and drain resulting in the source trench 120 and the drain trench 122 are epitaxially re-grown with a stress-inducing semiconductor material to form epitaxially re-grown raised source 135 and raised drain 136 in the source region and the drain region to enhance the stress. The tungsten contacts 128, having a stress different from an inherent stress of tungsten, may subsequently be deposited in the trenches. In one example, the initially grown raised source 114 and raised drain 116 may be etched for re-growth by performing directional anisotropic etching process such as, for example, a reactive ion etching process. In another example, the initially grown raised source 114 and raised drain 116 may be etched for re-growth using isotropic wet etch processes, which may result in the subsequent re-growth material 138 extending laterally, due to the lateral non-uniformity of the isotropic wet etch. It may be noted that the material used to epitaxially re-grow the stress-inducing material may be similar to the material used to initially create the raised source and the raised drain. It may also be noted that the epitaxial re-growth of the stress-inducing material may increase the spatial proximity of the stress-inducing material to the channel region of the fin structure, thus enhancing the transfer of stress from the source region and the drain region to the channel region of the fin structure.

Figure 6:
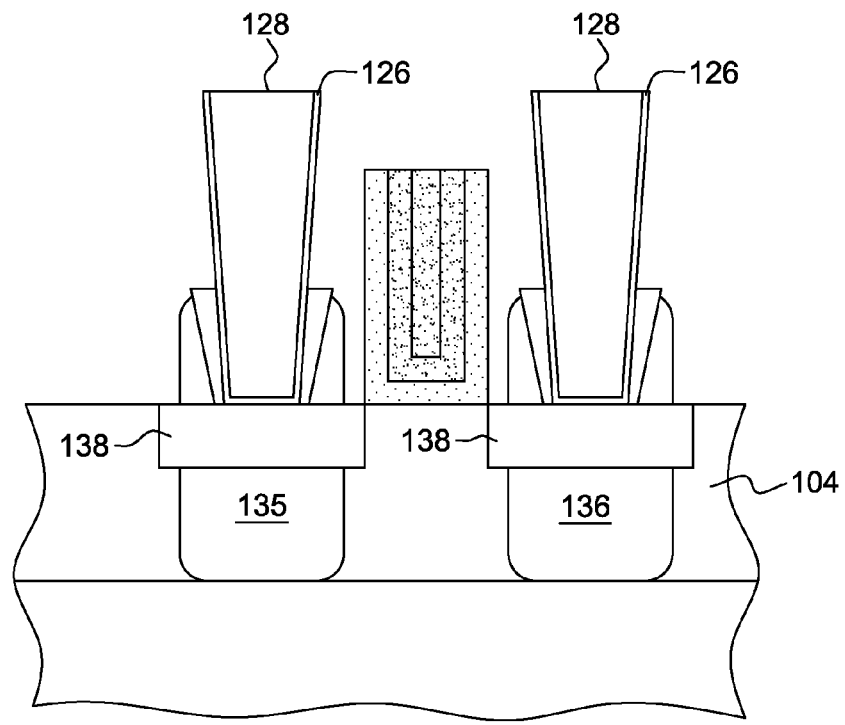
FIG. 6 depicts one example of the intermediate structure of FIG. 3, after epitaxial re-growth and trench etching of the raised source and the raised drain, in accordance with one or more aspects of the present invention.
Figure 7:
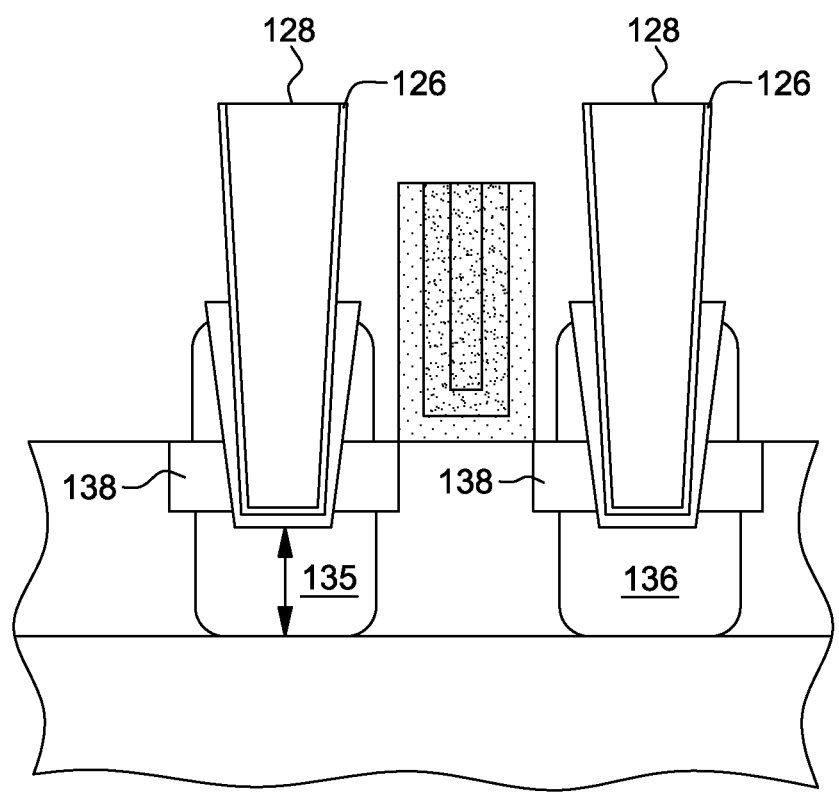
FIG. 7 depicts one example of the intermediate structure of FIG. 3, after epitaxial re-growth of the raised source and the raised drain, and etching a trench therein to a depth that is below a top surface of the fin, in accordance with one or more aspects of the present invention.

In an alternative or additional example, as shown in FIG. 7, the stress benefits of a deeper trench, discussed with respect to FIG. 5, and re-growth of the raised source and drain, discussed with respect to FIG. 6, are combined. As above, the raised source 114 in the source region and the raised drain 116 in the drain region are etched to create a source trench and a drain trench. The source trench and the drain trench may then be epitaxially re-grown with the semiconductor material similar to the material used to form the raised source and the raised drain. The enhanced stress generated in the tungsten contacts 128, during the deposition step discussed with respect to FIG. 4, may be transferred to the channel region situated under the gate by modulating the depth of the trenches discussed with respect to FIG. 5 and modulating epitaxial re-growth discussed with respect to FIG. 6.

Advantageously, as discussed above, the present invention enhances the inherent stress in the channel region situated under the gate by creating tungsten contacts for the source and drain so as to provide a stress different from an inherent stress of tungsten. The enhanced stress generated in the tungsten contacts is further transferred to the channel region by modulating parameters, such as, for example, the depth of the trenches and/or epitaxial re-growth of the portion of the raised source and drain removed by creating the source trench and drain trench. As a result, the net tensile stress transferred to the channel region by the present invention may be about 0.5 GPa to about 3 GPa. Similarly, the net compressive stress transferred to the channel region by the present invention may be about −0.5 GPa to about −3 GPa.

While several aspects of the present invention have been described and depicted herein, alternative aspects may be affected by those skilled in the art to accomplish the same objectives. Accordingly, it is intended by the appended claims to cover all such alternative aspects as fall within the true spirit and scope of the invention.

The invention claimed is:

1. A method, comprising:
providing an intermediate semiconductor structure of a FinFET, the structure comprising a semiconductor substrate and at least one fin coupled to the substrate, the at least one fin comprising a source region, a drain region and a channel between the source region and the drain region;
epitaxially growing a semiconductor material on the source region and the drain region;
removing the epitaxially grown semiconductor material;
epitaxially re-growing the semiconductor material on the source region and the drain region, such that a raised source and a raised drain are created;
etching a trench in the raised source and the raised drain; and
creating tungsten contacts in the raised source trench and raised drain trench, wherein the tungsten contacts have a stress different from an inherent stress of tungsten.

2. The method of claim 1, wherein etching the source trench and the drain trench comprises etching to a depth approximately parallel with a top surface of the at least one fin.

3. The method of claim 1, wherein etching the source trench and the drain trench comprises etching to a depth below a top surface of the at least one fin by about 10 nm to about 20 nm, wherein a height of the contacts is about 70 nm to about 120 nm, and wherein etching below the top surface comprises etching no lower than about 10 nm above a bottom surface of the at least one fin.

4. The method of claim 1, wherein the creating comprises:
lining the trenches with a contact liner; and
filling the lined trenches with tungsten under conditions altering an inherent stress of the tungsten.

5. The method of claim 4, wherein the stress on the channel is a tensile stress of about 0.5 GPa to about 3 GPa.

6. The method of claim 4, wherein the stress on the channel is a compressive stress of about −0.5 GPa to about −3 GPa.

7. The method of claim 4, wherein the stress is tensile, and wherein lining the trenches comprises:
depositing a layer of titanium in the trenches; and
depositing a layer of titanium nitride over the layer of titanium.

8. The method of claim 4, wherein the stress is compressive, and wherein lining the trenches comprises:
depositing a layer of titanium in the trenches; and
depositing a layer of liner material comprising tungsten over the layer of titanium.

9. The method of claim 1, wherein the FinFET is p-type, wherein the epitaxially growing comprises epitaxially growing silicon germanium, and wherein the epitaxially regrowing comprises epitaxially regrowing silicon germanium.

10. The method of claim 1, wherein the FinFET is n-type, wherein the epitaxially growing comprises epitaxially growing silicon phosphide, and wherein the epitaxially regrowing comprises epitaxially regrowing silicon phosphide.

11. A FinFET, comprising:
a semiconductor substrate;
at least one semiconductor fin coupled to the substrate, the at least one fin comprising a source, a drain and a channel between the source and the drain, the channel situated under a gate, wherein the source and the drain are raised and comprise a regrown epitaxial semiconductor material, wherein the re-grown epitaxial semiconductor material comprises a first growth of the epitaxial semiconductor material and a second growth after partial removal thereof; and
a source contact situated in a lined trench in the source and a drain contact situated in a lined trench in the drain, the contacts comprising tungsten and having a stress different from an inherent stress of tungsten, wherein the raised source and drain together with the tungsten contacts exert a desired stress on the channel.

12. The FinFET of claim 11, wherein the contacts have a height of about 70 nm to about 120 nm, and wherein a bottom surface of the contacts is about 10 nm to about 20 nm below a top surface of the fin.

13. The FinFET of claim 12, wherein a bottom surface of the contacts approximately coincides with a bottom surface of the gate and a top surface of the fin.

14. The FinFET of claim 11, wherein the desired stress comprises a compressive stress of about −0.5 GPa to about −3 GPa.

15. The FinFET of claim 11, wherein the desired stress comprises a tensile stress about 0.5 GPa to about 3 GPa.

16. The FinFET of claim 11, wherein the liner of the trenches comprises one of a bottom layer of titanium and a top layer of titanium nitride, and a bottom layer of titanium and a top layer comprising tungsten.

* * * * *